United States Patent [19]

Nissenson et al.

[11] Patent Number: 4,780,677
[45] Date of Patent: Oct. 25, 1988

[54] PROBE FOR NUCLEAR MAGNETIC RESONANCE SYSTEMS

[75] Inventors: Bilha Nissenson, Herzlia; Hanaan Keren, Kfar Saba; Itzchak Linnenberg, Netanya, all of Israel

[73] Assignee: Elscint Ltd., Herzila, Israel

[21] Appl. No.: 44,701

[22] Filed: May 1, 1987

[30] Foreign Application Priority Data

May 13, 1986 [IL] Israel ................................. 78767

[51] Int. Cl.$^4$ ............................................ G01R 33/20
[52] U.S. Cl. ................................................. 324/322
[58] Field of Search ............... 324/300, 307, 309, 318, 324/322

[56] References Cited

U.S. PATENT DOCUMENTS

| | | | |
|---|---|---|---|
| 4,517,516 | 5/1985 | Hill | 324/318 |
| 4,633,180 | 12/1986 | Biehl | 324/318 |
| 4,633,181 | 12/1986 | Murphy | 324/318 |
| 4,638,253 | 1/1987 | Jaskolski | 324/322 |
| 4,641,097 | 2/1987 | Bottomley | 324/318 |
| 4,649,348 | 3/1987 | Flugan | 324/322 |
| 4,680,548 | 7/1987 | Edelstein | 324/322 |
| 4,680,549 | 7/1987 | Tanttu | 324/322 |
| 4,694,255 | 9/1987 | Hayes | 324/322 |

OTHER PUBLICATIONS

Article by P. Mansfield et al., entitled "Fast Scan Proton Density Imaging by NMR", Journal of Physics E: Scientific Instruments, vol. 9, pp. 271-278, (1975).

*Primary Examiner*—Michael J. Tokar
*Attorney, Agent, or Firm*—Sandler & Greenblum

[57] ABSTRACT

An RF probe for acquiring MR data comprising four loop means. There are first and second loop means that are substantially round, centered about a longitudinal axis of said probe and spaced apart substantially the length of said probe to define a cylindrical shape therebetween. There are third and fourth loop means being substantially saddle shaped spaced apart, oppositely disposed and extending between said first and second loop means. Conductors attached to said first and second loop means at points on said first and second loop means spaced apart by 180 degrees couple said third and fourth loop means to said first and second loop means to form a point of psuedo-saddle coils providing extremely homogenous signals.

17 Claims, 2 Drawing Sheets

PROBE FOR NUCLEAR MAGNETIC RESONANCE SYSTEMS

FIELD OF THE INVENTION

This invention is concerned with magnetic resonance (MR) data acquisition systems. More particularly with radio frequency probes such as body probes used in such systems. The invention is related to the following earlier filed patent applications, assigned to the assignee of this invention: U.S. Ser. No. 668,944, filed on Nov. 7, 1984; entitled "Mutiple Feed Rf Coils" now U.S. Pat. No. 4,613,837; U.S. Ser. No. 713,689 filed on Mar. 19, 1985; entitled "Dual Frequency Surface Probe" now U.S. Pat. No. 4,691,163; U.S. Ser. No. 728,871, filed on Apr. 30, 1985, entitled, "Improved Body Probes" now U.S. Pat. No. 4,648,405, and U.S. Ser. No. 011,630, filed on Feb. 6, 1987, entitled "Hybrid Resonator".

BACKGROUND OF THE INVENTION

Magnetic resonance data acquisition systems generally comprise a large magnet for providing a static magnetic field of greater than one Tesla, for example. While other types of magnets could be used within the scope of the invention, in a preferred embodiment a superconducting magnet is used. The large static field tends to cause the average of the spins of atomic nuclei to align with the field.

Pulsed radio frequency (RF) signals are used in the presence of gradient magnetic field to nutate the aligned "spins" in selected portions of the sample. (see "Fast Scan Proton Density Imaging by NMR" by P. Mansfield et al, Jour. of Physics: Scientific Instruments 1976 Vol. 9 pp 271-278). When the RF pulse ends the nutated spins tend to return to the aligned condition. As the spins move in the magnetic field to return to alignment, free induction decay (FID) signals are generated. It is the FID signals that are most popularly used for imaging purposes.

The probes or coils used for transmitting the RF signals are also generally, though not necessarily, used for receiving the FID signals. The RF frequency used is the Larmor frequency. The Larmor frequency, as is well known, is a function of the particular element and the magnetic field strength in the nucleus' vicinity. For example, when the element is hydrogen with magnetic fields of slightly less than 2 Tesla, the Larmor frequency is greater than 80 MHz.

The static magnetic field is generated by the large magnet having a tunnel or bore into which the specimen or patient is placed. The RF coils or probes are generally built to fit within the bore and to be able to receive the patient (body probes) or parts of the patient within the coils.

A basic problem encountered with the probes and especially with the body probes is that they normally have low self-resonant frequencies. Thus, for example, the self resonance of body coils used in high magnetic fields, is generally lower than the Larmor frequency required to nutate spins in the high strength magnetic fields.

Another area of concern when using body probes in high strength magnetic fields is meeting government specifications such as the FDA regulation in the United States with regard to specific absorption rate (0.4 W/kg.) of the samples subjected to the high frequency RF pulses. A related problem is the electrostatic coupling that occurs between the probes and the subject.

The designers of the probes used in MR systems actually have at least two distinct frequencies subject to their control which they should take into account. They are the frequency of the RF power source, and the resonance frequency of the coil which is determined by its inductance and the capacitance; i.e. the length of the electrical path including distributed inductances, capacitances, and lumped inductors and capacitors.

To optimize the probe's operation the two frequencies should coincide. The RF frequency of the pulses used to nutate the spins (Larmor frequency) is determined by the element used for resonance and by the strength of the magnetic field at the spins. The body probe also should be turned to the Larmor frequency. The natural frequency of the inductors of the probe as turned by stray capacitances should be higher than the Larmor frequency. The coils of the probe should also be impedance matched to the power source so that the power supplied is utilized with a minimum of losses. In addition the probe should radiate a field whose magnitude is close to homogenous within the sample or subject.

Not surprisingly, the manufacture and supply of good RF probes for strong magnetic fields has been extremely difficult, among other reasons because of the relatively low self resonance of probes which are capable of assuring relatively homegeneous magnetic fields.

The most common design of probes used for MR data acquisition are known as saddle coils. These coils, especially when spanning a 120 deg. angle, produce a more homogenous field than do other designs. However, these saddle coils often have self resonant frequencies lower than the required Larmor frequencies. This is especially true of body probes big enough for body imaging. To overcome this inadequacy other types of coils such as "slotted cylinders" have been used in attempts to obtain higher self resonant frequencies. However, the slotted cylinder coils are not as inherently homogeneous as are the saddle coils and accordingly produce images with artifacts such as shadows which often make the images unsuitable for clinical use. Accordingly, scientists and researchers in the field are still attempting to provide probes for MR data acquisition which produce homogeneous electro-magnetic fields, minimize electrostatic coupling, provide large signal to noise ratios and have self resonant frequencies greater than 80 MHz, in fields slightly less than two Tesla.

Accordingly it is the object of the present invention to provide new and improved body probes of the type described.

BRIEF DESCRIPTION OF THE INVENTION

In accordance with a broad aspect of the present invention an RF probe for MR imaging is provided to generate homogeneous magnetic fields normal to the longitudinal axis of the probe, said RF probe comprising:

a pair of oppositely disposed spaced apart shaped end coils, said coils both being symmetrical about the same axis to thereby define a space therebetween, a pair of longitudinal coils each comprising: a pair of longitudinal conductors spaced apart by substantially 60 degrees, extending parallel to said axis essentially on the surface of said cylindrical space and located between said end coils, a pair of spaced apart transverse conductors, one of said transverse conductors connecting said pair of longitudinal conductors at each end thereof, said transverse conductors being adjacent and parallel to portions of said shaped end coils, means for connecting each of said longitudinal coils to each of said end coils at points spaced apart by 180 degrees on said end coils, and said means for connecting including RF power feed means, said RF power feed means comprising a single feed point for connecting RF pulses to said probe, A feature of the invention lies in a probe for MR data acquisition comprising four loops, said four loops comprising first and second circular loop means centered about a longitudinal axis of said probe and spaced apart the length of the probe, third and fourth loop means substantially saddle shaped and attached to said first and second circular loop means at points spaced apart by 180 degrees, coupling means for coupling said third and fourth loop means to said first and second circular loop means, said coupling means comprising conductors between each of said circular loops and said third and fourth loop means, said conductors including capacitor means; said capacitor means comprising at least a tuning capacitor serially connected in each of said conductors, and RF signal input means to said coil for connecting RF signals to said probe, said input means including a matching capacitor serially connected to said tuning capacitor in at least one of said conductors.

A further feature of the invention comprises coupling the four loops together to provide a pair of pseudo-saddle coils. For example, a first pseudo-saddle coil is comprised of a portion of said first circular loop means coupled through said coupling means to a portion of said third loop means and through said coupling means to a portion of the second of said circular loop means and from the second of said circular loop means through said coupling means to a portion of the fourth of said loop means and back through said coupling means returning to the first circular loop means.

A further related feature of the invention includes using a pair of longitudinal loop means as said third and fourth loop means with each longitudinal loop means extending over substantially 60 degrees of the 360 degrees enclosed by the circular loop means whereby each of said pseudo-saddle coils comprises essentially 120 degrees of each of the circular loop means and one longitudinal side of each of the longitudinal saddle shaped loop means.

Another related feature of the invention is that current flows through the two longitudinal conductors of each longitudinal coil in the same direction. It is the above described pseudo-saddle coils that produces the RF field. Yet another related feature of the invention is that in effect the current does not flow around the end coils but through the two 180 degrees arcs between connection points in opposing directions.

Yet another feature of the probe of the invention includes the capability of operating with only a single RF source attached to said probe and/or operating with a multiplicity of RF sources attached to the probe. When a single RF source is attached, natural equal amplitude points may be interconnected.

BRIEF DESCRIPTION OF THE DRAWINGS

The above named and other objects and features of the invention will be best understood when considered in the light of the following description of an embodiment of the invention made with reference to the accompanying drawings; wherein.

GENERAL DESCRIPTION

Figure 1:
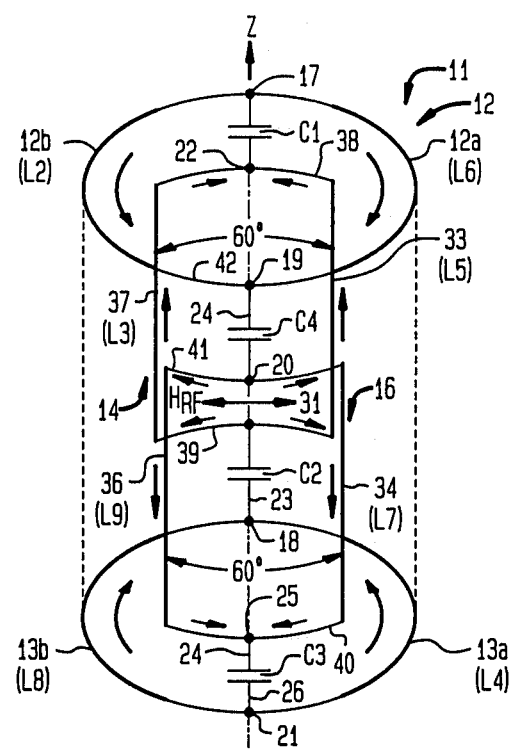
FIG. 1 is a pictorial schematic showing of the inventive probe.

FIG. 1 shows a schematic pictorial of the inventive pseudo-saddle probe at 11. The pseudo-saddle probe is comprised of a pair of spaced apart end coils 12 and 13. The coils are shown as being circular; actually, an exact circular shape is not required. It is preferred however that the heavy line sections 12a(inductor L6), 12b(inductor L2), 13a(inductor L4) and 13b(inductor L8) be arcuate. The end coils are spaced apart from each other by a distance that defines the length of the coil. In a preferred embodiment the coil is large enough to receive a patient as the subject therein. The end coils 12 and 13 are concentric about the same longitudinal axis which in a preferred embodiment coincides with the Z axis of MRI systems. In one preferred embodiment the diameter of the end coils, i.e. the "probe" is 55 cm and the distance between the end coils; i.e., the length of the probe is 50 cm. In that preferred embodiment, the coil elements are constructed from ⅜ inch copper tubing.

The probe includes a second pair of coils 14 and 16 shown extending longitudinally between the end coils and being oppositely disposed 180 degrees apart from each other on the imaginary cylinder defined by the end coils. The coils 14 and 16 are mirror-symmetrical with respect to a plane through their longitudinal axes that is perpendicular to a plane tangential to the longitudinal axis, and each coil extends for approximately 60 degrees around the imaginary surface defined by the end coils. The coils 14 and 16 are attached to the end coils 12 and 13 respectively, at points 17 and 18 for coil 14 and points 19 and 21 for coil 16.

More particularly longitudinal coil 14 is coupled to end coil 12 at point 17 through conductor 22 and capacitor means C1. Coil 14 is coupled to circular end coil 13 at point 18 through conductor 23 and capacitor means C2. Longitudinal coil 16 is coupled to end coil 12 at point 19 through conductor 24 and capacitor means C4. Longitudinal coil 16 is coupled to end coil 13 at point 21 through conductor 26 and capacitor means C3.

Figure 1A:
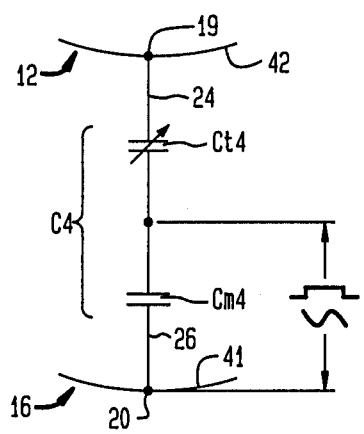
FIG. 1A is a detailed showing of the RF pulse or signal connection of the inventive probe.

At least one of the capacitor means includes a matching capacitor Cm in series with a tuning capacitor Ct as shown in FIG. 1A. Therein coil 12 is shown coupled to coil 16 over a circuit extending from point 19 through conductor 24, tuning capacitor Ct4, matching capacitor Cm4 and point 20 on coil 16. The RF pulse from a transmitter is coupled across the matching capacitor. It should be noted that a source of RF pulses can be coupled at each of the capacitor means or as desired at selected ones of the capacitor means. Where the source of RF is not coupled to the capacitor means, the matching capacitor is not required. Then, the capacitor means comprises only a single capacitor having the combined capacitance. To avoid the confusion of a plethora of capacitors, the drawing of FIG. 1. does not show the capacitors normally used to reduce eddy currents as is well known to those skilled in the art. In a preferred embodiment the coils are mounted on a plastic form. The current flows in the coils as shown by the arrows in FIG. 1. The Rf current in the four coils generate magnetic fields in the direction of the arrows 31, for example. The magnetic fields are normal to the longitudinal axis of the probe which in a preferred embodiment coincides with the Z axis of the magnetic resonance system. The same magnetic field direction would be induced by currents in two saddle coils. The two saddle coils are replaced in this invention by two pseudo-saddle coils comprised of the portions of the four coils drawn with heavy lines. One pseudo-saddle coil comprises end coil sections 12a(L6) and 13a(L4) and longitudinally extending conductors 33(inductor L5) and 34(inductor L7).

The second pseudo-saddle coil comprises end coil sections 12b(L2) and 13b(L8) and longitudinal extending conductors 36(inductor L9) and 37(inductor L3).

The longitudinal coils 14 and 16 are each comprised of the pair of longitudinally extending conductors joined by a pair of transverse conductors. The transverse conductors are preferably adjacent and parallel to the end coils. More particularly longitudinal coil 14 comprises longitudinal conductors 33 and 37. The longitudinal conductors are joined by transverse conductors 38 and 39 at opposite ends of the longitudinal conductors. Conductor 38 is adjacent to and substantially parallel to end coil 12. Transverse conductor 39 is adjacent to and substantially parallel to end coil 13.

Longitudinal coil 16 is comprised of longitudinal conductors 34 and 36. The longitudinal conductors are joined by transverse conductors 41 and 40. The transverse conductor 41 is adjacent and substantially parallel to end coil 12 while transverse conductor 40 is adjacent to and substantially parallel to end coil 13. The conductors joining the longitudinal coils to the end coils extend from approximately the center of the transverse conductors that are adjacent and substantially parallel to the end coils.

Each of the end coil sections 12, 13 which are shown with heavy lines constitute inductors in the probe arrangement of the invention. The transverse conductors 38, 39, 40 and 41 and those portions of the end coils that are adjacent and parallel to the transverse conductors effectively do not contribute any inductance because the current flowing in the end coils 12, 13 and in the adjacent transverse conductors 38, 39, 40 and 41 run in opposite directions and thus the magnetic fields generated by those currents cancel each other.

The RF pulse is coupled in a preferred embodiment to one feed point such as across matching capacitor Cm4. Points of equal voltage on the symmetrical circuit may be interconnected with no current flow. For example in FIG. 2 the centers of the inner coils are shown coupled together by the dashed lines. These are points of maximum current flow and minimum voltage. In the preferred embodiment the inner conductor of a shielded cable carrying RF is attached to the capacitor junction point. The shield ("ground") is connected to the other side of the matching capacitor.

Figure 2:
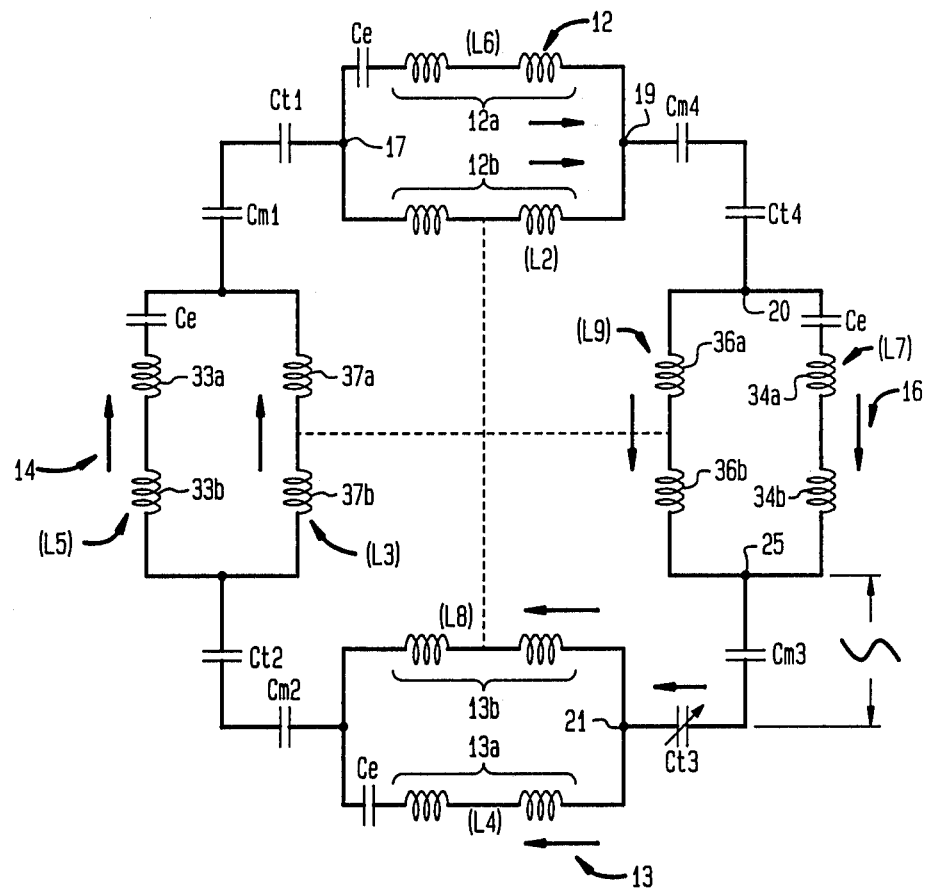
FIG. 2 is an equivalent lumped element showing of the inventive probe.

All of the inductor sections shown in FIG. 2 have equal inductances. Three of the capacitors are fixed equal capacitors that are selected to provide a desired resonant frequency. Adjustment of only one tuning capacitor is required to fine tune all of the resonant loops. All of the matching capacitors (where more than one is used) have equal ranges of capacitance to maintain the symmetry of the arrangement. In the preferred embodiment the current in all inductors is equal and the length of each longitudinal conductor is equal to the length of the 120 degree arcuate section of the circular end coils. In the preferred embodiment the capacitors Ct1, Ct2 and Ct4 used for tuning are 10 Pf capacitors.

The capacitor Ct3 has a range of 5–15 Pf. The matching capacitor Cm3 has a value of 50 Pf. The eddy current preventing capacitors Ce each have a value of 500 Pf. The self resonance of the inductors of the probe without the lumped capacitors is about 120 MHz. The operating resonance of the probe in a 1.9 Tesla field is 81 MHz. The high self resonance makes the operating resonance easy to obtain. The current directions on FIG. 2 make it obvious that the same current flow through both pseudo-saddle coils. Thus, the same current flows through all of the capacitors used for tuning and all of the matching capacitors. Thus, the resonating circuit includes all capacitors in series, and changing one tuning capacitor is sufficient to tune both pseudo-saddle coils. The feed current flows through the appropriate matching capacitor, say Cm3, and through all the other capacitors which are in series.

The self resonance of the pseudo-saddle coils shown in FIGS. 1 and 2 is higher than the self resonance of regular saddle coils having the same dimensions. The pseudo-saddle coils have self resonances, of the order of greater than 100 MHz, whereas regular saddle coils of the same dimension have self resonances of about 50 MHz.

The pseudo-saddle coil described herein can be used as a body probe or as a probe for the head or separate limbs; the fact that it operates at a much higher self resonance, is especially helpful when used as a body probe where the larger dimensions normally reduce the self resonance of the system. Preferably the pseudo-saddle coils are positioned so that the magnetic field generated by the pseudo-saddle coils is directed through the longer axis of elliptical cross sectional shaped body of the subject. The probe described herein simultaneously obtains the desired high resonant frequency and uniform symmetrically distributed currents. The high resonance is a result largely of splitting the coils into four separate loops separated by capacitors. The uniform current distribution is achieved by using the appropriate ratios of inductive and capacative reaction in each section. It was found that only one of the four tuning capacitors had to be tunable.

While the invention is described using exemplary probes, it should be understood that this description is by way of example only and not as a limitation on the scope of the invention.

What is claimed is:

1. A radio frequency (RF) probe for magnetic resonance (MR) imaging, said probe having a longitudinal axis and providing homogeneous RF magnetic fields normal to the longitudinal axis of RF the probe, said probe comprising;

a pair of oppositely spaced-apart shaped end coils, both of said pair of shaped, spaced apart end coils being substantially equally symmetrical about the said longitudinal axis thereby defining a volume there between, having the shape of the shaped end coils and a length equal to the distance between the spaced apart end coils, a pair of longitudinal inductors each comprising a pair of longitudinal conductors, parallel to said longitudinal axis and extending between said spaced apart end coils, each of said longitudinal inductors further comprising a pair of spaced-apart transverse conductors, one of said pair of spaced-apart transverse conductors connected to said pair of longitudinal conductors at each end thereof, said transverse conductors each having the shape of a portion of said shaped end coils and being substantially adjacent and parallel to said portion of said shaped end coils, means for connecting each of said pair of longitudinal inductors to both of said end coils at oppositely disposed connection points on each of said end coils, said longitudinal inductors being connected to said connection points from points mid-way between said longitudinal conductors on said transverse conductors, means for tuning said RF probe to resonance at a selected Larmor frequency, and means for coupling RF signals to said RF probe.

2. The RF probe of claim 1 wherein said end coils are round and said volume is round.

3. The RF probe of claim 2 wherein said round end coils are substantially circular end coils and wherein said round volume is substantially cylindrical.

4. The RF probe of claim 2 wherein said round coils are substantially elliptical end coils.

5. The RF probe of claim 1, wherein said means for tuning comprises tuning capacitors connected between each of said end coils and each of said longitudinal coils.

6. The RF probe of claim 1, wherein said tuning capacitor is in series with each longitudinal conductor in the connections between said end coils and said longitudinal coils.

7. The RF probe of claim 1, wherein said means for tuning comprises tuning capacitor means serially connected to all of said coils so that all of the series current flowing through all of the coils flows through each of said tuning capacitor means.

8. The RF probe of claim 7 wherein said tuning capacitor means comprises four tuning capacitors, a different one of said four tuning capacitors being serially connected in the connection between each of said coils so that all of the series current flows through each of the four tuning capacitors.

9. The RF probe of claim 7 wherein said tuning capacitor means comprises eight tuning capacitors, there being four tuning capacitors connected in series in each of said end coils, one at each side of said means for connecting said longitudinal coils to the end coils.

10. The RF probe of claim 7 wherein said tuning capacitor means comprises eight tuning capacitors, there being two tuning capacitors in each of said transverse conductors, one being connected on each side of said means for connecting said longitudinal coils to said end coils.

11. The RF probe of claim 6 and wherein said means for coupling RF signals to said RF probe comprises matching capacitor means in series with at least one of said tuning capacitors.

12. The RF probe of claim 1 including eddy current reducing capacitor means serially placed in said end coils and said longitudinal coils.

13. The RF probe of claim 1, wherein said longitudinal coils each extend over 60 degrees along a surface of said volume with the space between said longitudinal coils extending over 120 degrees along said surface.

14. An RF probe for acquiring MR data, said RF probe comprising:

four loops means comprising:

first and second loop means being substantially round and centered about a longitudinal axis of said probe and spaced apart substantially the length of said probe, third and fourth loop means being substantially saddle shaped spaced apart, oppositely disposed and extending between said first and second loop means, coupling means for coupling said third and fourth loop means to said first and second loop means, said coupling means comprising conductors attached to said first and second loop means at points on said first and second loop means spaced apart by 180 degrees, at least one of said conductors connected to capacitor means, said capacitor means comprising at least one tuning capacitor serially connected in said at least one conductor, and RF signal input means to said probe for connecting RF signals to said probe, said input means including a matching capacitor serially connected to said at least one tuning capacitor.

15. The RF probe of claim 14 wherein the means for coupling provides a pair of pseudo-saddle coils, a first pseudo-saddle coil of said pair of pseudo-saddle coils comprising a portion of said first loop means coupled through said coupling means to a portion of said third loop means and through said coupling means to a portion of said second loop means through said coupling mean to a portion of said fourth loop means and through said coupling means back to said portion of said first loop means.

16. The RF probe of claim 15 wherein said third and fourth loop means each extend over substantially 60 degrees of the 360 degrees covered by the substantially round first and second loop means such that each of said pseudo-saddle coils comprises essentially 120 degrees of the said 360 degrees of said first and second loop means and one longitudinal side of said third and fourth loop means.

17. The RF probe of claim 15 wherein said third and fourth loop means each comprise two longitudinal conductors and wherein current flows through said two longitudinal conductors in the same direction.

* * * * *